US008739092B1

(12) United States Patent
Ben-Tzur et al.

(10) Patent No.: US 8,739,092 B1
(45) Date of Patent: May 27, 2014

(54) FUNCTIONAL PROPERTY RANKING (75) Inventors: Asa Ben-Tzur, Skekhanya (IL); Ziyad Hanna, Haifa (IL)

(73) Assignee: Jasper Design Automation, Inc., Mountain View, CA (US)

( * ) Notice: Subject to any disclaimer, the term of this patent is extended or adjusted under 35 U.S.C. 154(b) by 0 days.

(21) Appl. No.: 13/455,926

(22) Filed: Apr. 25, 2012

(51) Int. Cl.
*G06F 17/50* (2006.01)

(52) U.S. Cl.
USPC ............. 716/108; 716/106; 716/113

(58) Field of Classification Search
USPC ............. 716/51, 52, 112, 106, 108, 113; 324/765; 702/118; 714/738, 742
See application file for complete search history.

(56) References Cited

U.S. PATENT DOCUMENTS

| | | | |
|---|---|---|---|
| 6,618,841 B1 | 9/2003 | Huang | |
| 7,243,322 B1 | 7/2007 | Ly et al. | |
| 7,325,209 B2 | 1/2008 | Mitra et al. | |
| 7,421,668 B1 * | 9/2008 | Ip et al. | 716/108 |
| 7,725,851 B2 | 5/2010 | Eisner et al. | |
| 7,908,532 B2 | 3/2011 | Eckelman et al. | |
| 7,926,020 B1 | 4/2011 | Lu et al. | |
| 7,958,475 B2 | 6/2011 | Khan | |
| 7,984,401 B2 | 7/2011 | Lehavot et al. | |
| 8,024,691 B2 | 9/2011 | Zilic et al. | |
| 8,326,778 B1 | 12/2012 | Lu et al. | |
| 2001/0016933 A1 | 8/2001 | Chang et al. | |
| 2002/0138812 A1 | 9/2002 | Johannsen | |
| 2004/0236560 A1 | 11/2004 | Chen | |
| 2005/0198611 A1 * | 9/2005 | Ebert et al. | 717/100 |
| 2005/0209840 A1 | 9/2005 | Baklashov et al. | |
| 2006/0066339 A1 * | 3/2006 | Rajski et al. | 324/765 |
| 2006/0156145 A1 | 7/2006 | Mitra et al. | |
| 2007/0294651 A1 | 12/2007 | Tsai et al. | |
| 2007/0299648 A1 | 12/2007 | Levitt et al. | |
| 2008/0082946 A1 | 4/2008 | Zilic et al. | |
| 2008/0184180 A1 | 7/2008 | Takenaka et al. | |
| 2009/0204931 A1 * | 8/2009 | Lim et al. | 716/5 |
| 2010/0088257 A1 | 4/2010 | Lu et al. | |

OTHER PUBLICATIONS

NextOp Software, Inc., "Assertion Synthesis," May 16, 2010, three pages. [Online] [Retrieved Nov. 1, 2011] Retrieved from the Internet <URL:http://web.archive.org/web/20100516025551/http://www.nextopsoftware.com/BugScope-assertion-synthesis.html.>
U.S. Appl. No. 13/347,114, filed Jan. 10, 2012, Inventor: Asa Ben-Tzur.
U.S. Appl. No. 13/231,583, filed Sep. 13, 2011, Inventors: Claudionor Jose Nunes Coelho Jr. et al.
United States Office Action, U.S. Appl. No. 13/231,583, Jul. 23, 2012, 11 pages.

* cited by examiner

*Primary Examiner* — Vuthe Siek
(74) *Attorney, Agent, or Firm* — Fenwick & West LLP (57) ABSTRACT

Tools for ranking of generated properties are described. A plurality of circuit design properties are generated from a signal trace of the circuit design. A static analysis of the circuit design properties is performed against one or more circuit design constraints to determine whether the properties are true. Rankings for the circuit design properties are determined responsive to results of the static analysis. The ranking for a circuit design property represents a value of the circuit design property in validating correct functionality of the circuit design. At least some of the circuit design properties are presented in a user interface responsive to the rankings for the circuit design properties.

22 Claims, 8 Drawing Sheets

| ID | PO | Type | classification | Definition |
|---|---|---|---|---|
| 18 | 7 | cover | unclassified | $overflow(arb.sample_timer_cnt,3,0) |
| 34 | 15 | assert | unclassified | $onehot0(arb.gnt) |
| 36 | 1 | cover | unclassified | $overflow(arb.port_idle_cnt1,511,0) |
| 37 | 2 | cover | unclassified | $overflow(arb.port_idle_cnt0,511,0) |
| 39 | 3 | cover | unclassified | $overflow(brdg.rd_ptr,15,0) |
| 40 | 4 | cover | unclassified | $overflow(brdg.wr_ptr,15,0) |
| 41 | 5 | cover | unclassified | $overflow(arb.port_idle_cnt3,511,0) |
| 42 | 6 | cover | unclassified | $overflow(arb.port_idle_cnt2,511,0) |
| 46 | 19 | assert | unclassified | ~brdg.rd_ready \|-> ~brdg.int_read_write[*2] |
| 47 | 19 | assert | unclassified | ~brdg.rd_ready \|-> $past(~brdg.int_read_write) |

```
% rank_error
INFO: the following properties will be ranked "low".
{? 27 (11) $onehot0({p_sel.int_read_done0,p_sel.int_read_done1,p_sel.int_read_done2,p_sel.int_read_done3})}
{? 29 (12) $onehot0({p_sel.new_tran0,p_sel.new_tran1,p_sel.new_tran2,p_sel.new_tran3})}
{? 31 (13) $onehot0({p_sel.int_ready0,p_sel.int_ready1,p_sel.int_ready2,p_sel.int_ready3})}
{? 33 (14) $onehot0(eg.nxt_state)}
```

FUNCTIONAL PROPERTY RANKING

BACKGROUND

1. Technical Field

This disclosure relates generally to circuit design properties, and more particularly to ranking of circuit design properties.

2. Description of the Related Art

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation, and formal verification. RTL describes the registers of a computer or digital electronic system and the way in which data are transferred among the combinational logic between registers.

During some of these verification techniques, a circuit design may be tested against a set of properties to evaluate the operation of the circuit design. Properties are statements or expressions about some expected behavior of the circuit design. Some properties can be shown to be true or false during verification testing. Properties can be manually created by a circuit designer that examines the circuit design and manually codes the properties based on the circuit designer's own knowledge of the circuit design. Other tools may automatically generate circuit design properties to expedite the verification of the circuit design.

Tools that automatically generate circuit design properties are often over-inclusive and generate a large number of properties. Presenting all of these properties to the circuit designer with no additional information is overwhelming to the circuit designer. Additionally, property verification is a computationally intensive task and some of the automatically generated properties may be redundant or of little use in testing the circuit design. Thus, testing the circuit design against all of these properties would waste valuable computing resources and extend the time needed to verify a circuit design.

SUMMARY

Embodiments described herein relate to tools for ranking of generated circuit design properties. In one embodiment, a plurality of circuit design properties are generated from a signal trace of the circuit design. A static analysis (e.g., formal verification) the plurality of circuit design properties is performed against one or more circuit design constraints to determine if the circuit design properties are true. Rankings for the circuit design properties are determined responsive to the results of performing the static analysis. The ranking for a property represents a value of the property in validating correct functionality of the circuit design. At least some of the circuit design properties are presented in a user interface based on the rankings for the circuit design properties. By leveraging static analysis to rank the properties, properties can be quickly and accurately ranked and presented to a circuit designer in a manner that allows the circuit designer to identify which properties should be used for further testing of the circuit design.

In one embodiment, the constraints include a description of the circuit design or baseline properties. In one embodiment, a result of the static analysis may indicate that the property is true, that the property is false, or that the truth of the property is unknown, for example, due to the static analysis reaching a durational limit prior being able to conclusively prove whether the property is true. The result is then used to determine rankings for the generated properties that represent the value of the generated properties in validating functionality of the circuit design.

The figures depict various embodiments of the present disclosure for purposes of illustration only. One skilled in the art will readily recognize from the following discussion that alternative embodiments of the structures and methods illustrated herein may be employed without departing from the principles of the disclosure described herein.

DETAILED DESCRIPTION

Tool Flow for Property Generation and Property Ranking

Figure 1A:
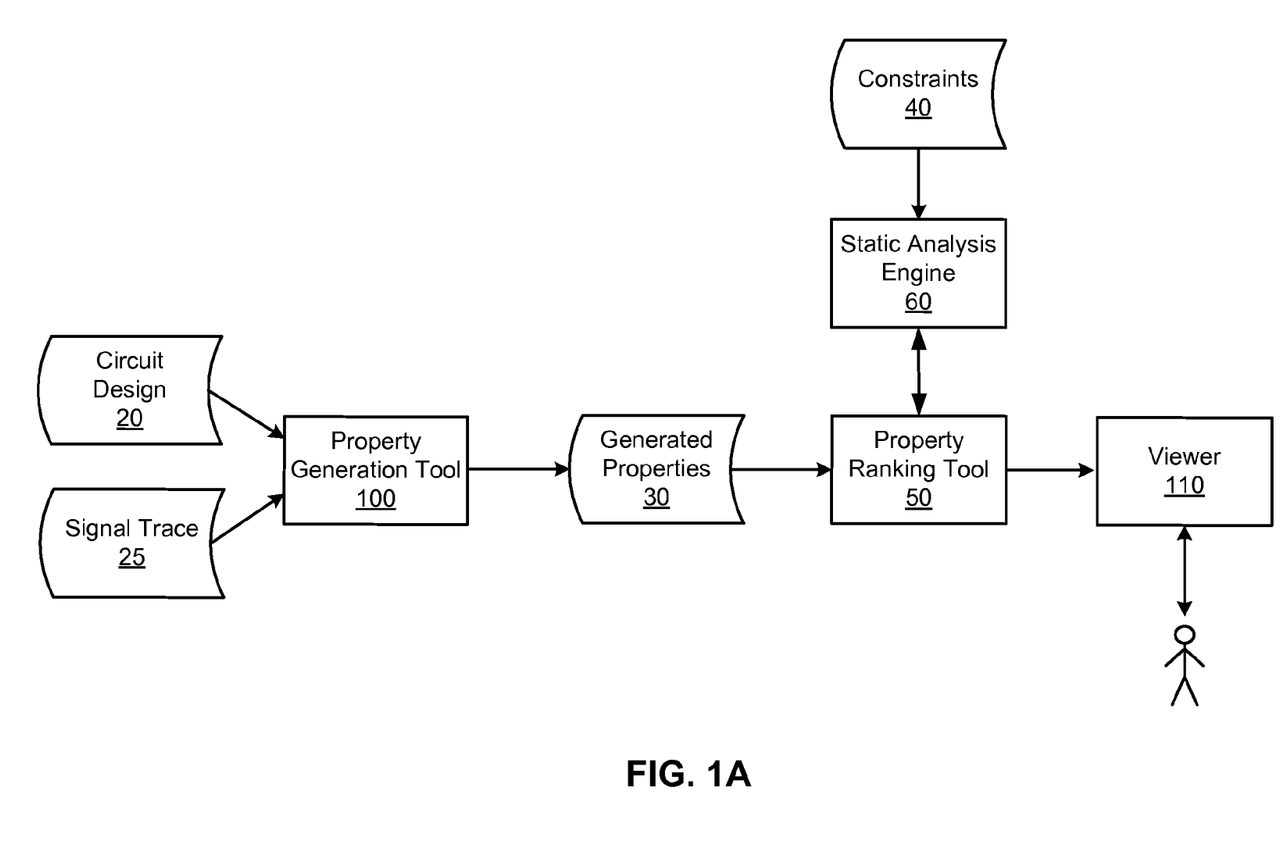
FIG. 1A is a diagram of property generation and ranking in accordance with an embodiment.

FIG. 1 illustrates a diagram of property generation and ranking for a circuit design 20, according to an embodiment. The description of the circuit design 20 describes the structural design and operation of a circuit. The description of the circuit design 20 may be embodied as register transfer level (RTL) source code encoded using a hardware description language (HDL) such as Verilog HDL or VHDL. In other embodiments, the description of the circuit design 20 may be embodied as a gate level netlist. The signal trace 25 includes signal values for signals in the circuit design 20 over a number of clock cycles, which describes the signals of the circuit design 20 during operation of the circuit design 20. The trace 25 may have been generated during a simulation of the circuit design 20. The trace 25 may be stored to disk and retrieved by the analysis tool 100 or passed along directly from a process that generated the trace 25.

A property generation tool 100 receives the circuit design 20 and signal trace 25 as inputs and generates a set of generated properties 30. There may be a large number of properties (e.g. >100 properties) in the set of generated properties 30. In one embodiment, the properties 30 are generated by analyzing the circuit design 20 in conjunction with the signal trace 25 and inferring the properties from the signal values in the signal trace 25. The generated properties 30 describe some behavior of the circuit design, such as the relationship between two or more signals in the circuit design. The properties 30 may be assertions, where the assertion is satisfied if the property is true for all operating conditions of the circuit design 20. A plain language example of an assertion is "if A is 1, B must be 1 in the next clock cycle." The properties 30 may also include covers, where the cover is satisfied if the property is true for some operating condition of the circuit design 20. A plain language example of an cover is "if A is 1, B could be 1 in the next clock cycle." The properties 30 may also include assumptions, where an assumption rules out some operating condition of the circuit design 20. A plain language example of an assumption is "assume that if A is 1, B must be one in the next clock cycle".

The property ranking tool 50 receives the set of generated properties 30 and determines rankings for the properties 30. The rankings represent the value of the generated properties 30 in validating correct functionality of the circuit design. The value of a property may be influenced by factors such as the complexity of the functionality expressed by the property or the frequency of errors associated with the functionality expressed by the property. Specifically, the property ranking tool 50 invokes a static analysis engine 60 when ranking the properties 30. The static analysis engine 60 statically analyzes the properties 30 against a set of constraints 40 to prove a truth of the properties under the given constraints 40. In one embodiment, the constraints 40 can include a description of the circuit design 20. In other embodiments, the constraints 40 can include baseline properties, such as assumption properties that are written by a circuit designer and embedded into the description of the circuit design 20.

For each property 30, the static analysis engine 60 produces a result that may indicate whether (1) the property is true (2) the property is false or (3) the truth of the property is unknown. The truth of a property may be unknown if the static analysis engine 60 is unable to prove a truth of the property after a limited period of time. The property ranking tool 50 then uses these results to determine rankings for the generated properties 50 that represent the predicted value of the generated properties in testing the circuit design. By leveraging the results of the static analysis engine 60, the property ranking tool 50 is able to generate rankings that accurately predict the value of the generated properties 30 in a short amount of time.

In the context of the disclosure, static analysis refers to techniques for processing constraints (e.g. circuit design or baseline properties) using either mathematical logic or algorithmic traversal methods to traverse a state space represented by the constraints, aiming to analyze the functional behavior of the constraints. Static analysis techniques may analyze the behavior of a circuit design without actually exercising the signals of a circuit design with simulation inputs. Two examples of static analysis include formal verification and structural traversal, but other types of static analysis are also possible.

In one embodiment, the static analysis engine 60 is a formal verification engine that uses formal mathematical techniques to prove that assertion properties are either always true, or if not always true, to provide an example condition (called a counterexample) that demonstrates the property is false. Formal verification is typically more exhaustive than simulation based testing and can exercise states of the circuit design that are missed by simulation. Examples of formal verification techniques include binary decision diagram (BDD) based formal verification and boolean satisfiability (SAT) based formal verification.

Once the generated properties 30 are ranked, some or all of the generated properties 30 are presented according to their rankings in a user interface via the viewer 110. By ranking and then displaying the generated properties 30 according to the rankings, the circuit designer is thus presented with the generated properties 30 in a manner that allows the circuit designer to quickly and easily select the important properties that should be used when testing the circuit design. The generated properties 30 selected by the circuit designer may then be used to perform extensive verification tests on the circuit design 20.

Method for Property Generation and Property Ranking

Figure 1B:
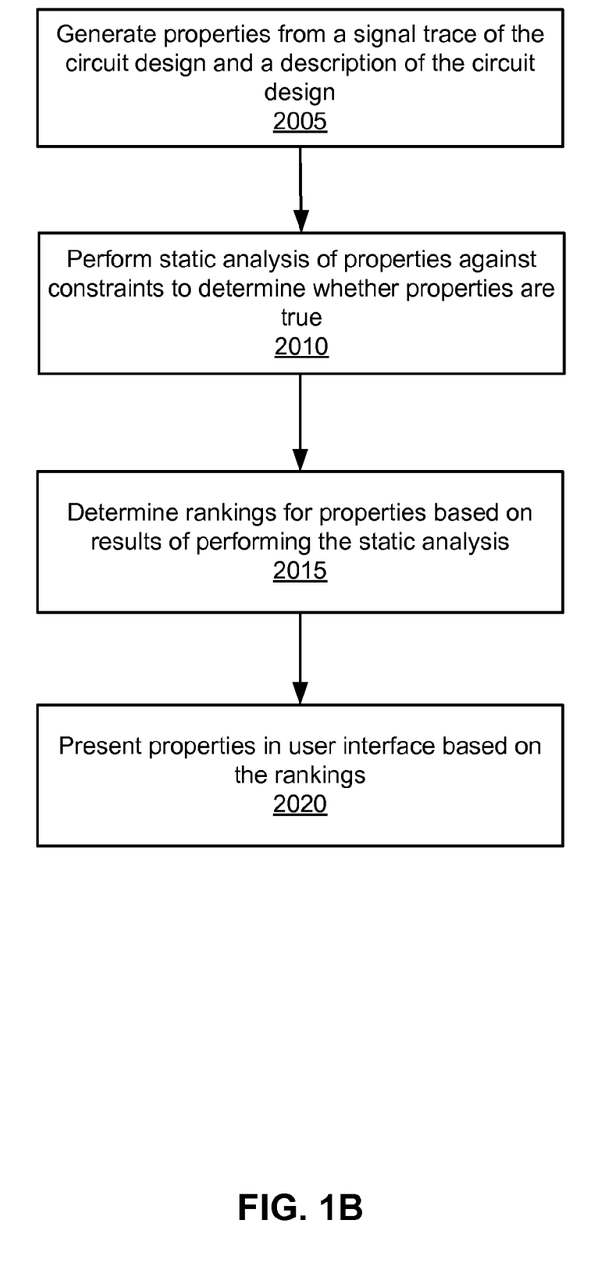
FIG. 1B is a flowchart of a method of property generation and ranking in accordance with an embodiment.

FIG. 1B is a flowchart illustrating a method for property generation and property ranking, according to an embodiment. In step 2005, the property generation tool 100 generates a set of properties 30 from a trace of the circuit design 25 and the description of the circuit design 20. In one embodiment, the property generation tool 100 generates properties 30 by identifying recurring signal patterns in the signal trace 25 and generating properties that describe these recurring signal patterns. In one embodiment that will be described in conjunction with FIGS. 2, 3A, 3B, 4A, 4B, 4C and 4D, the property generation tool 100 first identifies a point of interest (POI) from the description of the circuit design 20. A POI is a set of signals that are related to each other and may represent a feature in the circuit design. Examples include first in first out (FIFO) circuits, finite state machines (FSM), any synchronous portion of the circuit design that accepts a clock signal as an input and uses the clock signal as a timing reference, etc. The property generation tool 100 then determines if the signal values of the POI, as shown in the signal trace 25, match a property detection rule that specifies a behavioral relationship between signals of the circuit design. For signals having values that match the property detection rule, a property is generated that describes the relationship between the signals.

Other examples of property generation are described in commonly owned U.S. application Ser. No. 13/231,583, filed on Sep. 13, 2011 and titled "Generating Properties for Circuit Designs," and commonly owned U.S. application Ser. No. 13/347,114, filed on Jan. 10, 2012 and titled "Generating Circuit Design Properties from Signal Traces," which are incorporated by reference herein in their entirety.

In step 2010, the property ranking tool 50 invokes the static analysis engine 60 to perform static analysis of the generated properties 30 against one or more constraints 40. The static analysis engine 60 applies a static analysis algorithm to determine whether the generated properties 30 are true under the constraints 40. For purposes of explaining the disclosure, it is assumed that the static analysis algorithm being applied by the static analysis engine 60 is a formal verification algorithm, however, in other embodiments other static analysis algorithms may be used instead.

When the static analysis engine 60 uses formal verification, the generated properties 30 and constraints 40 are presented to the static analysis engine 60 as a formal verification problem. The constraints 40 are treated as conditions of the circuit design that are assumed to be true. The generated properties 30 are treated as assertions that may or may not be true in view of the constraints and are tested against the constraints 40 to determine if they are true or false.

For example, one of the generated properties 30 may be following property:

$$a \mid \rightarrow c \tag{GP1}$$

Generated property GP1 requires that if signal a is asserted, then signal c must also be asserted in the same clock cycle. Given generated property GP1, the static analysis engine 60 attempts to determine, in view of the constraints 40 and under all possible operating scenarios, if signal c is always asserted when signal a is asserted. If so, property GP1 is true. If not, property GP1 is false.

As previously mentioned, the constraints 40 may include a description of the circuit design. When the constraints 40 include a description of the circuit design, the static analysis engine 60 attempts to formally verify the properties 30 against the description of the circuit design to determine if the properties are true. Alternatively, the constraints 40 may include baseline properties. When the constraints 40 include baseline properties, the static analysis engine 60 attempts to formally verify the properties against the baseline properties. For example, the baseline properties may be the following properties:

| | |
|---|---|
| a |-> b | (BP1) |
| b |-> c | (BP2) |

Baseline property BP1 requires that if signal a is asserted then signal b must also be asserted in the same clock cycle. Baseline property BP2 requires that if signal b is asserted then signal c must also be asserted in the same clock cycle. If generated property GP1 is formally verified against baseline properties BP1 and BP2, the result of the formal verification would indicate that generated property GP1 is true due to the associative nature of BP1 and BP2.

In addition, the constraints 40 may include both the description of the circuit design and the baseline properties. When the constraints 40 include both the description of the circuit design and the baseline properties, the static analysis engine 60 attempts to formally verify the generated properties 30 against both the description of the circuit design and the baseline properties.

The property ranking tool 50 also limits the amount of time that the static analysis engine 60 can spend performing the static analysis. Formal verification algorithms can be computationally intensive and execute for hours if left unchecked, so restricting the run-time of the static analysis engine 60 to a fixed duration decreases the amount of time needed to rank the generated properties 30. The run-time of the static analysis engine 60 may be restricted to a fixed duration of time (e.g. 3 seconds). Alternatively or additionally, because formal verification algorithms may operate in iterative cycles, the run-time of the static analysis engine 60 may be restricted to a fixed number of cycles (e.g. 6 cycles). Assuming the constraints 40 include a description of the circuit design, during the cycles, the formal verification algorithm explores different possible scenarios of the circuit design starting from a set of reset states in an attempt to prove the truth of the generated properties 30. Each scenario represents a different execution trace through the states of the circuit design and the formal verification algorithm checks the correctness of the properties along the states.

Once the static analysis engine 60 completes performing the static analysis, the static analysis engine 60 returns a set of results to the property ranking tool 50. The set of results may include a different result for each generated property 30 that was tested. Each result indicates that (1) the generated property is proven true, (2) the generated property is proven false, or (3) the truth of the generated property is unknown. The truth of the property is typically unknown when the run-time of the static analysis engine 60 reaches the fixed time or cycle limit without conclusively determining if property is true or false. In other embodiments, the set of results may include other types of results other than those described herein.

In step 2015, the property ranking tool 50 determines rankings for the properties 30 according to results generated by performing the static analysis. In one embodiment, properties that are true are given a low ranking to indicate that these properties are not valuable in validating correct functionality of the circuit design. Properties that are false are given a high ranking to indicate that these properties are valuable in validating correct functionality of the circuit design. Properties that have unknown truth are also given a high ranking to indicate that these properties are valuable in validating correct functionality of the circuit design.

True properties are given a low ranking because being able to quickly determine the truth of a property is a sign that the property is duplicative of baseline properties or describes some behavior of the circuit design that is trivial. False properties are given a high ranking because the falsity of a property is a sign that the property has hit a potential design error. Properties having unknown truth are given a high ranking because an unknown truth indicates the property represents a complex behavior of the circuit design that could not be completely verified within a limited amount of time, and thus should be tested in greater detail.

The property ranking tool 50 thus leverages the results of the static analysis to predict the value of the generated properties 30 based on whether the generated properties 30 can be proven true within fixed time constraints, and whether the properties are proven true or false. Beneficially, rankings generated from the static analysis results accurately reflect how useful the properties 30 are in testing the circuit design. Additionally, as the run-time of the static analysis engine 60 is limited in its duration, the properties 30 can be ranked in a fast and efficient manner.

In one embodiment, the property ranking tool 50 determines rankings by assigning ranking scores to the properties 30. The ranking scores represent the value of the properties 30 in testing the circuit design. The ranking scores may be binary (e.g. 0 or 1). For example, true properties may be given a ranking of 0 to indicate a low value, whereas all other properties are given a ranking of 1 to indicate a high value. The ranking scores may scaled within a range of numbers (e.g. between 0-100). For example, true properties may be given a score of "0", false properties may be given a score of "60", and properties with unknown truth may be given a score of "75".

Other factors may be also taken into consideration when generating the ranking scores. Certain classes of properties 30 that are pre-determined to have high validation value (e.g. FIFO overflow properties) may be assigned higher rankings than other classes of properties 30 that are pre-determined to have low validation value (e.g. constant properties such as "S1==1"). Statistical measures can also be used in generating the ranking scores. For example, if a property is "s1|→s2", the frequency of events where s1==1 and s2==1 in the signal trace 25 can be used to increase a ranking of a property as the frequency increases. An amount of time spent by the static analysis engine 60 in determining a validity of a property may also be used to the adjust the ranking by increasing the score as the amount of time increases. Any of these factors can be combined together in order to generate a ranking score.

In another embodiment, the property ranking tool 50 determines rankings by assigning the properties 30 to different ranking categories. The predicted value of a property is indicated by the category that the property is assigned to. For example, true properties may be assigned to a "low value" category, whereas false properties and properties of unknown truth may be assigned to a "high value" category. In this embodiment, a subset of the properties, such as false properties and those of unknown truth, may be identified and grouped together for display to the user. The property ranking tool 50 can thus be viewed as a property filter that separates low value properties from high value properties.

In step 2020, the generated properties 30 are presented in a user interface based on the determined rankings for the properties 30. For a circuit designer viewing the user interface, the presentation of the properties 30 according to their rankings allows the circuit designer to easily identify the properties 30 that should be used in testing the circuit design. Through the user interface, the circuit designer may edit the properties 30, change the ranking of the properties 30, or select some of the properties 30 for further verification testing.

Figure 1C:
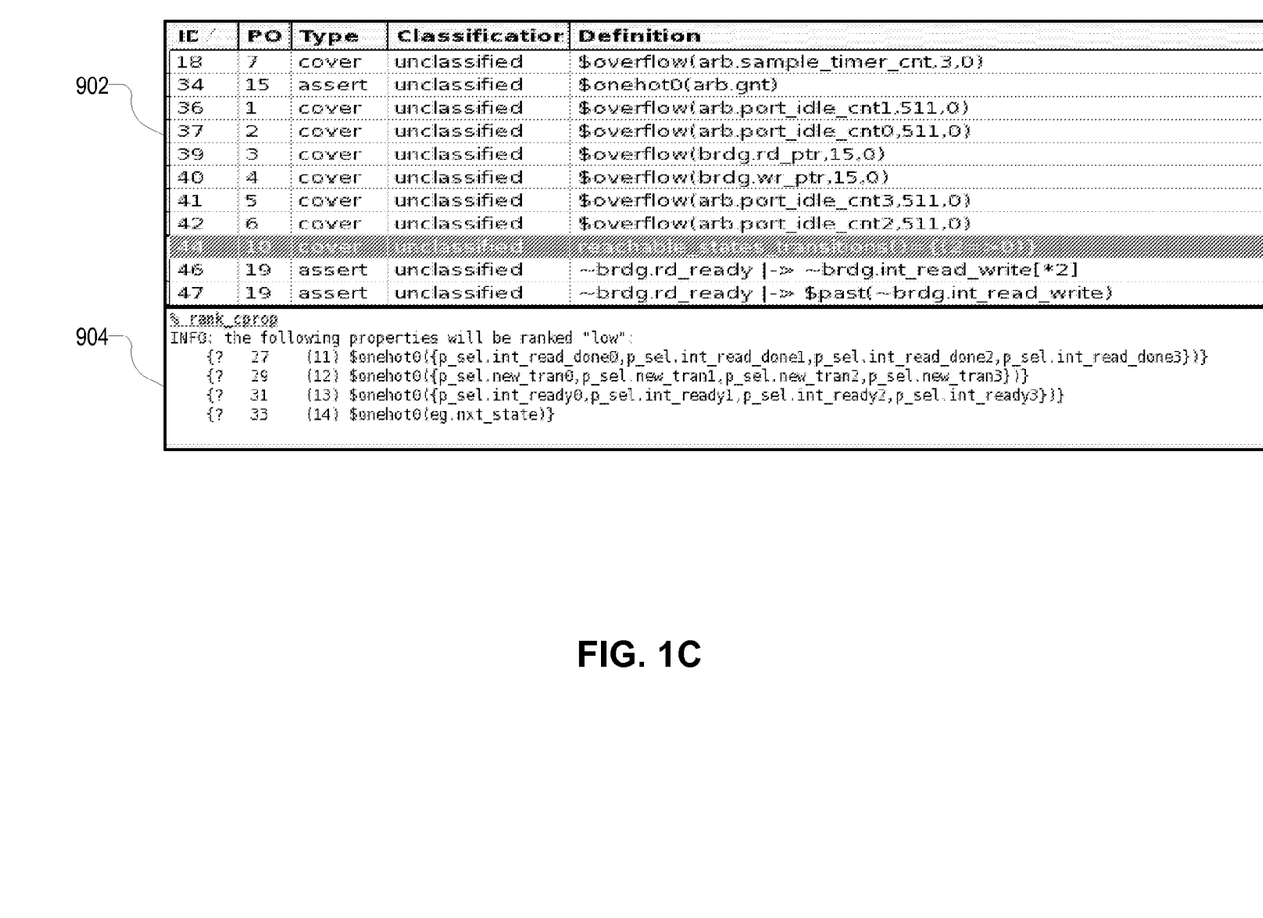
FIG. 1C is a user interface that includes properties organized according to their rankings, according to one embodiment.

In one embodiment, properties 30 may be presented in the user interface by organizing the properties 30 in the user interface according to their predicted value, such as from highest ranking to lowest ranking. In another embodiment, high ranking and low ranking properties are organized into separate sections of the user interface. FIG. 1C illustrates a user interface that includes properties 30 organized according to their rankings, according to one embodiment. The user interface is separated into two sections 902 and 904. Section 902 includes properties that have a high ranking and are likely to have a high value in validating correct functionality of the circuit design. For example, section 902 may include properties with ranking scores exceeding a threshold, or properties assigned to a "high value" category. Section 904 includes properties that have a low ranking and are not likely to have any value in validating correct functionality of the circuit design. For example, section 904 may include properties with ranking scores below a threshold, or properties assigned to a "low value" category. In FIG. 1C, both the low and high ranked properties are shown to the user. In other embodiments the low ranked properties may be hidden from view such that only the high ranked properties are presented in the user interface.

In other embodiments, presenting the generated properties 30 in the user interface may include presenting an indication of the rankings in conjunction with the properties 30. For example, properties that have a high value may be highlighted in the user interface. As another example, the ranking scores for the properties 30 may be presented next to the properties 30 in the user interface.

Example and Method of Property Generation

One embodiment of generating properties 2005 in the property generation tool 100 is now described by reference to FIGS. 2, 3A, 3B, 4A, 4B, 4C and 4D.

As used herein, a handshake property is a property that describe a handshake protocol. During handshaking, a receiving circuit receives a communication request (e.g., a REQ signal) from a requesting circuit and responds to the request by sending an acknowledgement (e.g., an ACK signal) back to the requesting circuit. A handshake protocol refers to one or more rules that are followed by the request and acknowledge signals during handshaking. A handshake property may describe the handshake protocol using parameters such as the minimum number of clock cycles before a request is acknowledged, the maximum number of clock cycles before a request is acknowledged, as well as other types of parameters that are relevant for a handshake protocol. Other examples of parameters can be found in the assert_handshake property defined by the Open Verilog Library (OVL).

As used herein, a fairness property describes shared resource arbitration among multiple requestors to ensure that no requestor is starved of access to the shared resource. Circuit designs often include multiple circuits that have access to a shared resource, such as a shared communication bus. Access to the bus is controlled by an arbitration circuit that allocates access fairly among the requesting circuits. Fairness properties describe shared resource arbitration among multiple requestors to ensure that no requestor is starved of access to the shared resource. For example, suppose one requestor requests access to a shared bus via the req0 signal and receives an acknowledgement of that request via the ack0 signal. Another requestor requests access to the shared bus via the req 1 signal and receives an acknowledgement of that request via the req 1 signal. A fairness property of assert fairness (req0,req1,ack [1:0]) may check for the following conditions: if req<i> and req<j> are both pending (for any i !=j pair), then req<i> shall not be acknowledged twice before acknowledging req<j>.

Figure 2:
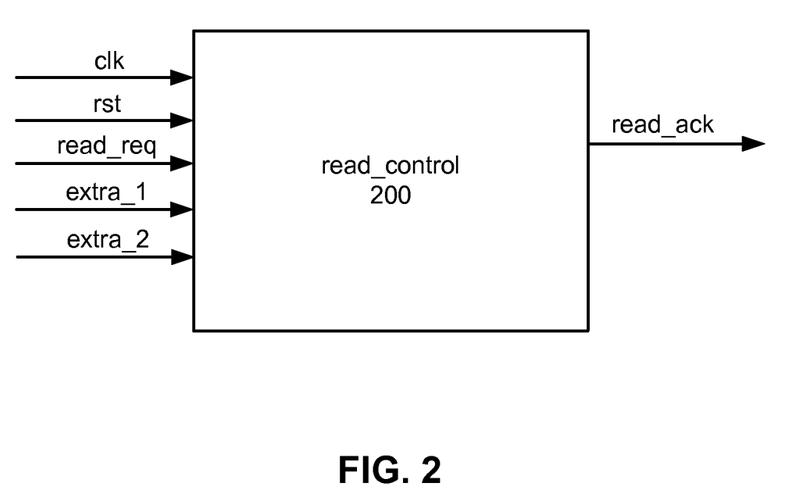
FIG. 2 is a block diagram of a portion of a circuit design, according to an embodiment.

FIG. 2 is a block diagram of a portion 200 of a circuit design, according to an embodiment. For ease of explanation, the operation of the property generation tool 100 will be described by using the circuit of FIG. 2 as an example. In other embodiments, the principles described herein may be applied to other portions of a circuit design that have a different number of inputs or outputs or have different functionality.

As shown, clk, rst, read_req, extra_1 and extra_2 are the input signals to a read_control module 200. Read_ack is the output signal from the module 200. The module 200 also includes a 3 bit read_delay register (not shown) that maintains information used for controlling the operation of the module 200. In some embodiments, the read_control module 200 may represent an arbitration circuit that controls access to a shared resource, such as a communication bus. Signal read_req thus represents a request to access a shared resource and read_ack represents an acknowledgement of that request. In RTL, the code that defines the basic structure of the circuit 200 may read:

```
01      module read_control (clk, rst, read_req, read_ack, extra_1,
extra_2);
02          input clk;
03          input rst;
04          input read_req;
05          output reg read_ack;
06          reg [2:0] read_delay;
07          input extra_1
08          input extra_2
```

In the RTL, part of the code that defines the functions of the circuit 200 may read:

```
17      always @(posedge clk or negedge rst) begin
18          if (~rst) begin
19              read_delay <= 0;
20              read_ack <= 0;
21          end
22          else if (read_delay!=0) begin
23              read delay <= read delay - 3'b001;
24              read_ack<= 0;
25          end
26          else if (read_req) begin
27              read_delay <= 3'b111;
28              read_ack <= 1;
29          end
30      end
```

Line 17 indicates that the module 200 is positive edge-triggered. Lines 18-21 indicate that if rst is logic low, the read_delay register is cleared out and the read_ack signal is set to logic low, thereby resetting the state of the module 200.

Lines 22-25 indicate that if read_delay is not zero, read_delay is decremented by one and read_ack is set to logic low. Lines 26-29 indicate that if read_req is logic high, the read_delay register is set to "111" and read_ack is set to logic high. The function of the extra_1 signal and extra_2 signals are not shown in this portion of the code. The functionality of these signals is not defined in this portion of the code as the precise function of these signal is not needed for explaining the disclosed embodiments.

Figure 3A:
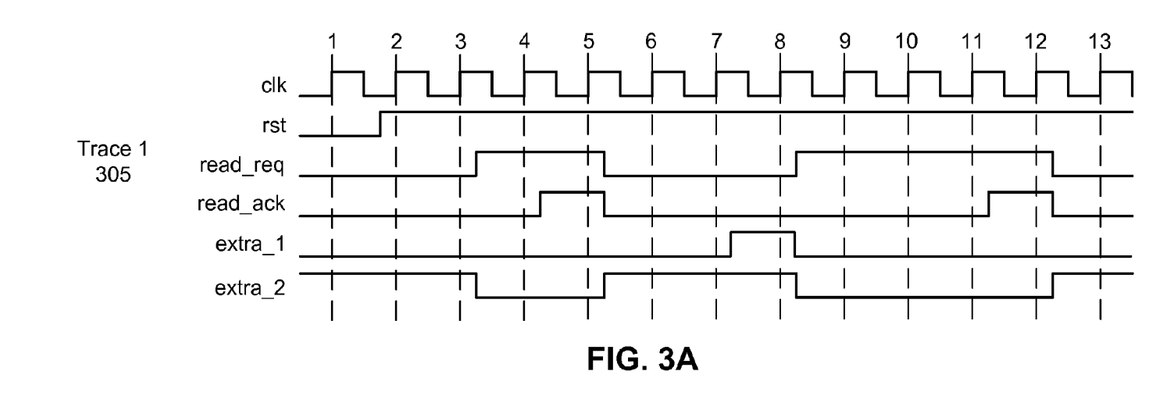
FIG. 3A is a signal trace for the portion of the circuit design of FIG. 2, in accordance with an embodiment.
Figure 3B:
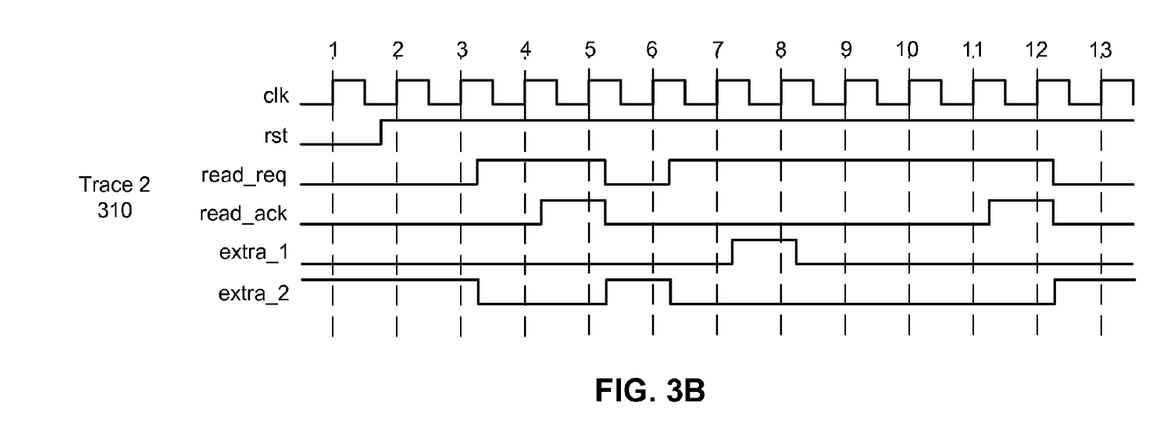
FIG. 3B is another signal trace for the portion of the circuit design of FIG. 3, in accordance with an embodiment.

FIGS. 3A and 3B are waveforms of two different traces for the input and output signals of the module 200 of FIG. 2, according to an embodiment. Both trace 305 and 310 show that that whenever read_req is asserted, read_ack is asserted at a later clock cycle as an acknowledgement of that request. Read_req stays asserted until read_ack is asserted, and read_ack can only be asserted once every eight clock cycles. The extra_1 signal is asserted during cycle 8 only. The extra_2 signal is an inverted version of the read_req signal. Only six signals are shown in these two traces 305 and 310, but in other embodiments the traces may have signal values for a large number (e.g., millions) of signals spanning a large number (e.g., millions) of clock cycles.

Figure 4A:
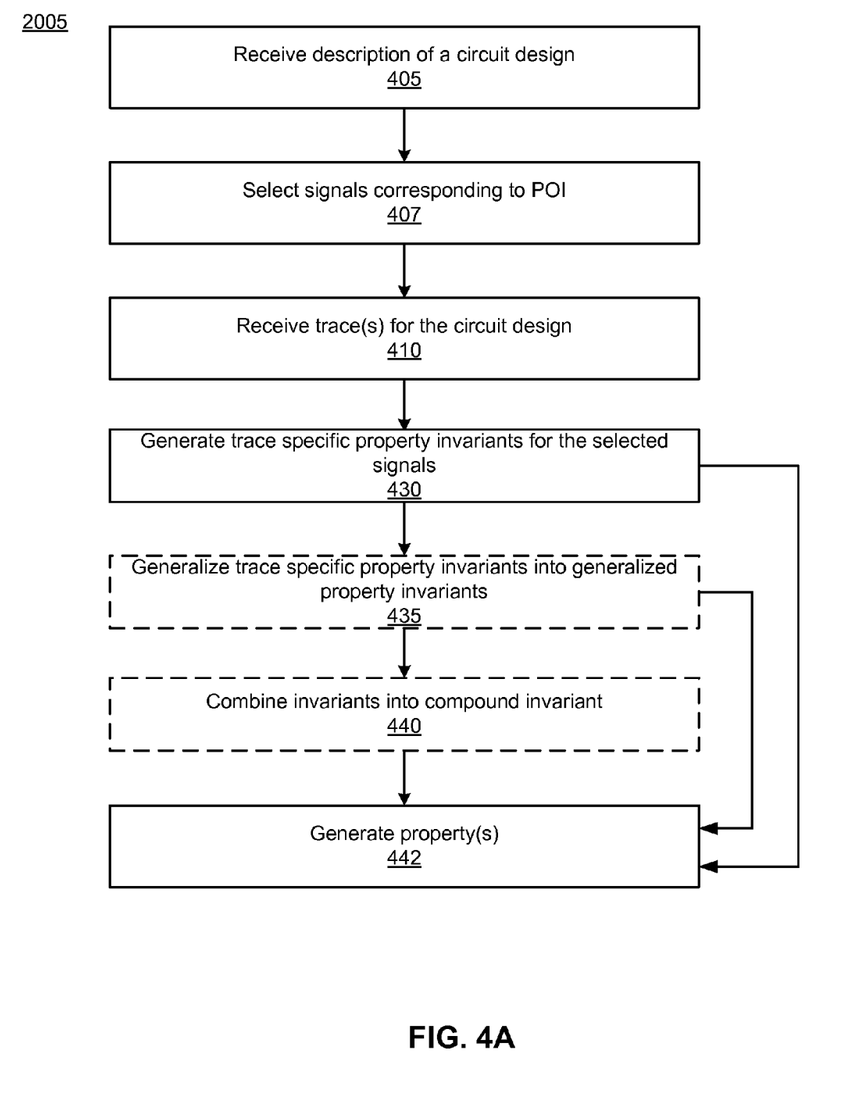
FIG. 4A is a flowchart of a method performed by a property generation tool, in accordance with an embodiment.

FIG. 4A is a flowchart of a method for generating circuit design properties 2005 performed by a property generation tool 100, in accordance with an embodiment. FIGS. 4A-4D will be explained in conjunction with FIGS. 2, 3A and 3B.

In step 405, the property generation tool 100 receives a description of a circuit design. For example, the description of the circuit design may include the RTL code for the read_control module 200 and RTL code for other portions of the circuit design. The description of the circuit design may include a large number of signals, some of which will be selected for further analysis in order to generate properties.

In step 407, the property generation tool selects a point of interest (POI) in the circuit design and a set of signals that correspond to the POI. As previously described, a POI is a set of signals that are related to each other and may represent some feature in the circuit design. For example, a POI may be a synchronous portion of the circuit design that accepts a clock signal as an input and uses the clock signal as a timing reference. The POI may be selected according to a user input that explicitly identifies a portion of the circuit design as the POI. For example, a user may explicitly flag the read_control module 200 as a POI, and the tool extracts the module 200 interface (e.g., read_req, read_ack, extra_1, extra_2) as the signals for that POI. Alternatively, the tool may apply a set of heuristic rules to identify a POI. For example, the property generation tool may search for any portions of the description of the circuit design 20 having RTL code that implements FSM functionality and identify those portions of circuit design 20 as POIs. Other examples of rules that can be used to identify a POI are described in commonly owned U.S. application Ser. No. 13/231,583, filed on Sep. 13, 2011 and titled "Generating Properties for Circuit Designs," which is incorporated by reference herein in its entirety.

In step 410, the property generation tool receives one or more signal traces that include information about the signals of the circuit design, such as signal values for the circuit design signals over a number of clock cycles. For example, the signal traces may include information that can be used to generate the visual waveforms shown in FIGS. 3A and 3B.

In step 430, the property generation tool generates trace specific property invariants for the selected signals 430. A property invariant can be viewed as a logic relation between signals that holds true throughout the trace and may be used in later steps to generate a property for the circuit design. In one embodiment, an invariant associates a particular type of property (e.g., handshake, fairness), the signals of the circuit design that are relevant to the property type, and any parameters that describe some attribute or limitation of the property type. As there may be multiple signal traces, each trace is analyzed individually to generate a set of one or more property invariants that are specific to that trace. The result of step 430 is multiple sets of trace specific property invariants, each set being associated with a single signal trace. Continuing with the example from FIGS. 3A and 3B, a handshake property invariant may be generated for the signal trace 305 from FIG. 3A, and another handshake property invariant may be generated for the signal trace 310 from FIG. 3B.

In step 435, the property generation tool 100 generalizes the trace specific property invariants across different signal traces to create generalized property invariants. A generalized property invariant is an abstracted version of the trace specific property invariants that represents a behavior of the circuit design across all traces. A generalized property invariant is also a more accurate representation of the behavior of the circuit design than the individualized property invariants because it holds true across multiple signal traces. Continuing with the example from FIGS. 3A and 3B, the trace specific property invariants may include trace specific handshake properties for FIGS. 3A and 3B, and the generalized property invariant generated in step 435 is an abstracted version of the two trace specific handshake property invariants.

In step 440, the property generation tool combines the generalized invariants into compound property invariants. A compound property invariant represents the combination of different generalized property invariants to describe a behavior of the circuit design that is different than that represented by the generalized property invariants. For example, the generalized property invariants may include handshake property invariants and a one-hot property invariant. A one-hot property may specify that for a group of signals, the only legal combination of values are those where a single signal is high and all others are low. The property generation tool combines the handshake property invariants and one-hot property invariant to create a fairness property invariant. In one embodiment, the compound property invariants may be composed from the trace specific property invariants instead of the generalized property invariants.

In step 442, the property generation tool generates one or more properties of the circuit design from the property invariants. The properties may be generated from either the trace specific property invariants identified in step 430, the generalized property invariants identified in step 435, or the composed property invariants identified in step 440. In one embodiment, the properties are generated as assertion properties, assumption properties, or cover properties.

Figure 4B:
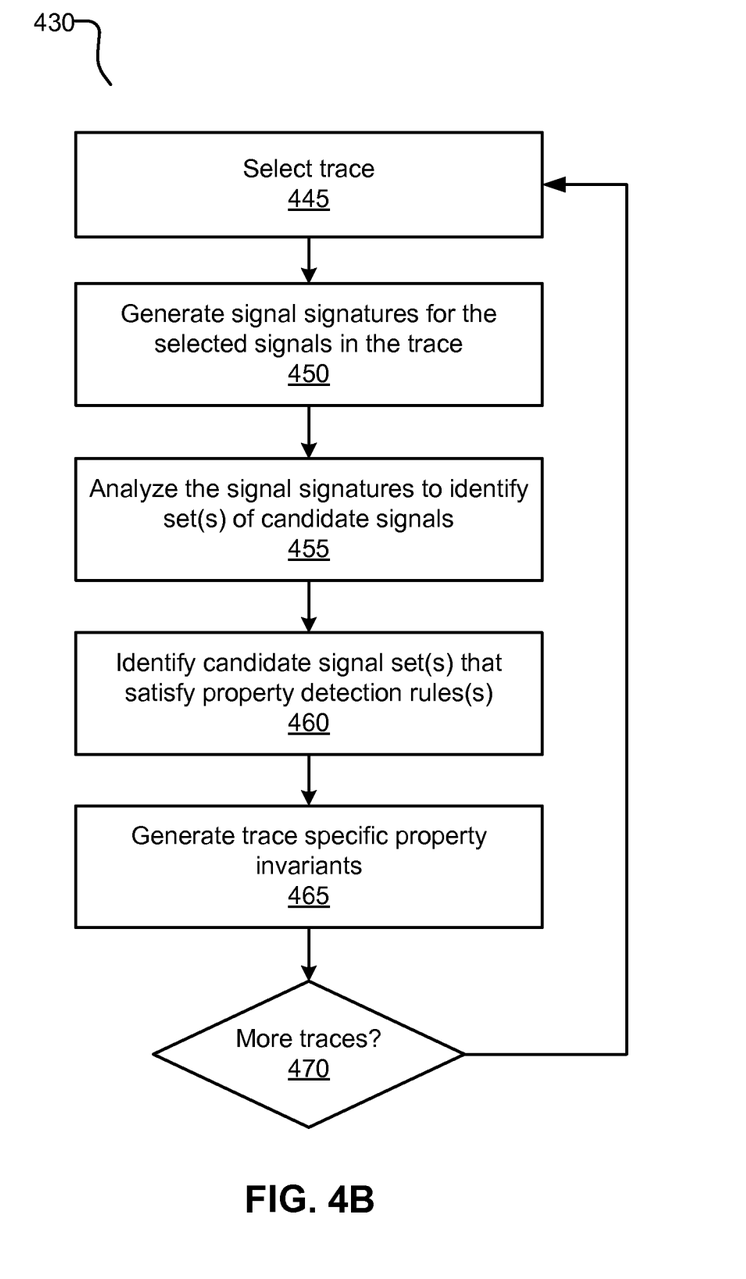
FIG. 4B is an expanded view of the step for generating trace specific property invariants from FIG. 4A, in accordance with an embodiment.

FIG. 4B is an expanded view of the step 430 for generating trace specific property invariants from FIG. 4A, in accordance with an embodiment. As shown, the step 430 for generating trace specific property invariants for the selected signals can be divided into additional sub-steps, such as steps 445-470. At this point in the process, one or more signal traces have been received and several signals have been selected as corresponding to a POI of the circuit design. In step 445, one of the traces is selected for analysis. Traces are analyzed one at a time to generate trace specific property invariants for each of the traces.

In step 450, signal signatures are generated for the selected signals of the POI. Each signal signature is a concise representation of the characteristics of a single signal as determined from the signal's values in the trace. Continuing with the example from FIG. 3A, one signal signature can be generated for the read_req signal. Another signal signature can be generated for the read_ack signal. Another signal signature can be generated for the extra signal. The signal signatures are generated over a trace segment of any length such that each signal signature is representative of all the signal values for a given signal within that trace segment. In some embodiments, the trace segment may include all of or less than all of the clock cycles in a trace.

Examples of signal characteristics that can be used to generate the signal signature include: zero cycle count, value count, or continuous cycle count. In other embodiments, the signal characteristics can include any other characteristics that can be extracted from the signal values and concisely represented in a signal signature.

The zero cycle count refers to the number of clock cycles during which a signal is logic low, i.e. has a logic level of "0". Continuing with the example from FIG. 3A, read_req in trace 305 has a zero cycle count of "6" because it has a logic level of "0" during six clock cycles: 2, 3, 6, 7, 8, and 13. Clock cycle 1 is ignored because rst is de-asserted during the first clock cycle. Similarly, signal read_ack has a zero cycle count of "10" because it has a logic level of "0" during ten clock cycles: 2, 3, 4, 6, 7, 8, 9, 10, 11 and 13. Clock cycle 1 is ignored because rst is de-asserted during the first clock cycle. In some embodiments, a one cycle count may be used instead of the zero cycle count. The one cycle count refers to the number of clock cycles during which a signal is logic high.

The value count represents how often the signal switches signal values and be determined from an indication of how frequently the signal switches values. In one embodiment, value count can be determined by counting the number of continuous periods of time during which the signal stays at a particular logic level. Continuing with the example from FIG. 3A, read_req in trace 305 has a value count of "5" because it takes on a total of five signal values by switching from 0→1→0→1→0 during cycles 2-13. Clock cycle 1 is ignored because rst is de-asserted during the first clock cycle.

Continuous cycle count refers to the number of continuous cycles that a signal stays at one signal value before switching to a different signal value. In one embodiment, the continuous cycle count can be input into a hash function to compute a hash value of the continuous cycle count. The hash value for a signal will be relatively unique to the signal, although it may be possible that some signals will share the same hash value. Continuing with the example from FIG. 3A, read_req starts at logic zero for 2 cycles, switches to logic one for 2 cycles, switches to logic zero for 3 cycles, switches to logic one for 4 cycles, and switches to logic zero for the last cycle. The numbers 2, 2, 3, 4 and 1 would thus be the continuous cycle count that is input to a hash function to compute the hash value for read_req. Any of a number of different hash functions can be used to compute the hash value. In other embodiments, the hash value can be computed from other characteristics of the signal values other than the continuous cycle count.

The following table illustrates some of the information that may be included in the signal signatures for the read_req and read_ack signal in trace 305. Signal signatures may not be generated for clk and rst because these signals are pre-determined to be irrelevant to generating properties.

| Signal | Zero Cycle Count | Value Count | Hash of continuous cycle count |
| --- | --- | --- | --- |
| read_req | 6 | 5 | 77847 |
| read_ack | 10 | 5 | 90719 |

-continued

| Signal | Zero Cycle Count | Value Count | Hash of continuous cycle count |
| --- | --- | --- | --- |
| extra_1 | 11 | 3 | 120565 |
| extra_2 | 6 | 5 | 77874 |

In step 455, the property generation tool analyzes the signal signatures to identify sets of candidate signals for further analysis. Each set of candidate signals can include two or more signals that are candidates for the application of more computationally intensive property detection rules. In one embodiment, the property generation tool applies candidate detection rules to the signal signatures that are designed to filter out irrelevant signals while also identifying sets of signals that are candidates. The candidate detection rules for a given property may be specific to the type of property that is being generated. For example, when generating a handshake property, the tool may apply one or more of the following candidate detection rules:

(1) The value count of a signal's signature is compared to a threshold value, and if the value count is less than the threshold, the signal is eliminated from consideration. Having a value count that is less than a threshold indicates that the signal is relatively constant and is unlikely to be useful in generating properties. In some embodiments, the threshold is set to "1" so that only signals with completely constant values are filtered out.

(2) A signal's hash value is compared to the hash value of other signals. If two signals have the same hash value, this indicates that the two signals could be, but are not necessarily, duplicates or logical complements of each other. For signals that have the same hash value, the property generation tool analyzes the signal values of these signals to determine if the signals are in fact duplicates or logical compliments. If two signals are duplicates or logical complements, one of the signals is eliminated from consideration while the other signal is retained. The selection of which signal to retain can be arbitrary.

(3) The zero cycle count of two signals can be used to determine the active cycle count of the two signals. Signals are typically active low or active high, and active cycle count refers to the number of cycles during which a signal is asserted. The active cycle count of the first signal is compared to the active cycle count of the second signal. If the active cycle count of the first signal (i.e. a signal assumed to correspond to REQ) is greater than the active cycle count of the second signal (i.e. a signal assumed to correspond to ACK), the signals are a potential REQ-ACK pair and identified as a set of candidate signals. This is because, when two signals follow a handshaking protocol, the REQ signal is active more often than the ACK signal.

In one embodiment, identifying sets of candidate signals can be divided into two substeps. First, individual signals may be filtered out and eliminated from consideration if they do not satisfy one or more candidate detection rules. Continuing with the example from FIG. 3A. signals read_req and extra_2 are inverted from each other and have the same hash value. By applying rule (2) to the hash values of read_req and extra_2, it is identified that these two signals are logical complements of each other. Signal extra_2 is thus eliminated from consideration while signal read_req is retained.

Second, signals that remain are evaluated against additional candidate detection rules to form sets of candidate signals. Continuing with the example from FIG. 3A, after rule (2) is applied, the remaining signals are now read_req, read_ack, and extra_1. These remaining signals are grouped into pairs of signals and rule (3) is applied to the zero cycle counts of the signals in each pair. Because read_req is active for more cycles than read_ack and extra_1, the application of rule (3) results in both {read_req, read_ack}, {read_req, extra_1} being identified as sets of candidate signals. Because read_ack is active for more cycles than extra_1, {read_ack, extra_1} is also identified as a set of candidate signals.

For POIs that are associated with a large number of signals, the process of generating properties can be computationally intensive if the signal values for each of the signals are to be analyzed in detail. By leveraging the signal signatures to identify sets of candidates for further analysis, signals that are irrelevant to generating a property are effectively filtered out while keeping the signals that are potentially relevant. The more computationally intensive operations of the next step 460 are then performed only on the sets of candidate signals.

In step 460, the property generation tool then identifies, from the candidate signal sets, one or more sets of the candidate signals sets that satisfy one or more property detection rules. The property detection rules for a given property invariant may be specific to the type of property that the invariant represents, and the rules may describe a relationship between two or more signals of the circuit design. To determine if candidate signal sets satisfy the property detection rules, the tool performs the computationally intensive task of analyzing the signal trace and comparing the signal values of the candidate signals to each other. Property invariants are generated for the candidate signal sets that satisfy the property detection rules. For sets of candidate signals that do not satisfy the rules, it is determined that these candidate signal sets are not relevant and thus property invariants are not generated for these sets of candidate signals.

The property detection rules may differ depending on the type of property invariant that is being generated. In one embodiment when generating a handshake property invariant for a handshaking protocol, the property generation tool first determines if the relationship between the candidate signals satisfies the rule "ACK|→REQ", which means that whenever a signal that is assumed to be ACK is asserted, a signal that is assumed to be REQ is also asserted in the same clock cycle. The property generation tool then applies the following rules: (1) REQ stays asserted until ACK becomes asserted (2) when REQ and ACK are asserted, they de-assert at the same time (3) every ACK assertion is associated with a unique REQ assertion (4) ACK can only stay asserted for one clock cycle (5) the last REQ assertion can be without an ACK assertion.

Continuing with the example from FIG. 3A, {read_req, read_ack}, {read_req, extra_1}, and {read_ack, extra_1} have been identified as sets of candidate signals. For signal pair {read_req, read_ack}, the signal values for read_req and read_ack are checked to determine if they comply with the rule "read_ack|→read_req". Because read_ack is asserted during cycles 5 and 12 and read_req is also asserted during these cycles, the first rule is met. Signals read_req and read_ack are then checked against the five additional property detection rules. Because these two signals do satisfy the additional property detection rules, {read_req, read_ack} is identified as a set of candidate signals that a handshake property invariant will be generated for.

For signal pair {read_req, extra_1}, extra_1 is asserted during cycle 8 but read_req is not asserted during cycle 8. Similarly, for signal pair {read_ack, extra_1}, extra_1 is asserted during cycle 8 but read_req is not asserted during cycle 8. Thus, neither of these two sets of candidate signals satisfy the property detection rule of "ACK|→REQ" and handshake property invariants will not be generated for these sets of candidate signals.

In other embodiments, handshaking protocols have different sub-types that behave differently from the other handshaking sub-types. Each sub-type of the handshaking protocol may be associated with its own set of candidate detection rules or property detection rules.

As another example, the property generation tool may apply a set of property detection rules designed to identify a one-hot property invariant. A one hot-property specifies that, for a group of signals, the only legal combination of values are those where a single signal is high and all others are low. In one embodiment, the rules for identifying a one-hot property invariant are that (1) there is a vector of signals that includes at least three signals, and (2) at each cycle only one signal in the vector has the value of "1."

In step 465, one or more trace specific property invariants are generated from the subset of candidate signals that satisfy the property detection rules. Property invariants can be generated in any form that is appropriate for representing the relationship between two or more signals. In one embodiment, a property invariant is simply generated by associating a type of the property that was detected (e.g., handshake property, one-hot property) with the candidate signals that satisfied the detection rules for the property. Alternatively, some textual representation of the property invariant that includes this information can be generated.

Some property invariants may have parameters that describe an attribute of the property invariant. In one embodiment, for property invariants that have parameters, values for the parameters are also determined by analyzing the signal values of the signals associated with the property invariant. Continuing with the example from FIG. 3A, the property invariant generated for trace 305 may be "$handshake (read_req, read_ack, 1, 3, 1, 0, 0)." The first parameter ("1") is the minimum delay between when read_req is asserted and when read_ack is asserted. The second parameter ("3") is the maximum delay between when read_req is asserted and when read_ack is asserted. The third parameter ("1") is the handshake protocol sub-type that was detected. The fourth parameter ("0") is the de-assertion count, which is the number of cycles that read_req stays asserted after read_ack is de-asserted. The fifth parameter ("0") is the maximum number of back-to-back transactions.

In step 470, the tool determines if more traces are available for analysis. If so, steps 445 through 465 are repeated for the additional traces to determine additional trace specific property invariants. For example, steps 445 through 465 can be repeated for trace 310 from FIG. 3B to determine a trace specific property invariant for trace 310. The trace specific property invariant determined by analyzing trace 310 may be "$handshake(read_req, read_ack, 1, 5, 1, 0, 0)." The handshake property invariant for trace 310 differs from the handshake property invariant for trace 305 in that the maximum request-to-ack delay is now "5" instead of "3".

Referring back to FIG. 4A, in one embodiment the trace specific invariant may be directly used to generate 442 a property. For example, the property generated for trace 305 may be "assert $handshake(read_req, read_ack, 1, 3, 1, 0, 0)" which is a assertion property that asserts that read_req and read_ack should always follow a specified handshaking behavior. As another example, the property generated for trace 315 may be "assert $handshake(read_req, read_ack, 1, 5, 1, 0, 0)" which is a assertion property that asserts that read_req and read_ack should always follow a specified handshaking behavior. In another embodiment, the trace specific invariants are instead generalized 435 into generalized property invariants, which are explained by reference to FIG. 4C.

Figure 4C:
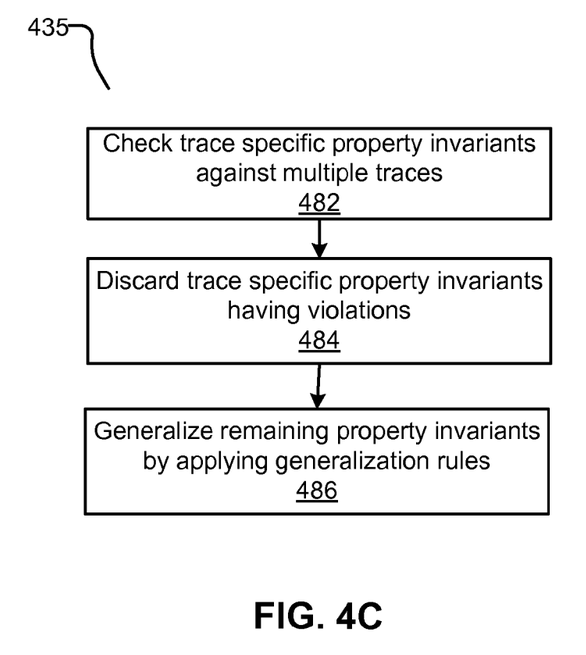
FIG. 4C is an expanded view of the step for generalizing trace specific property invariants into generalized property invariants, in accordance with an embodiment.

FIG. 4C is an expanded view of the step 435 for generalizing trace specific property invariants into generalized property invariants, in accordance with an embodiment. At this point in the process, the tool has generated trace specific property invariants for multiple traces. The trace-specific property invariants represent the behavior of a single trace, but may not represent the behavior of the circuit design across all traces. Thus, in step 482, each trace specific property invariant is checked against the other traces to identify violations of the trace specific property invariants. A violation exists if the invariant does not hold true in the other traces. In step 484, if a violation exists, the property invariant is discarded. On the other hand, if a violation does not exist, the property invariant is kept and passed on to step 486.

In step 486, the remaining trace specific property invariants are generalized into a more abstract version of the property invariants. Property invariants can be generalized when they describe the behavior of the same set of signals and the property invariants are of the same property type (e.g., handshake properties). Specifically, property invariants are generalized by applying a set of generalization rules that are associated with the property type. For handshake properties, the generalization rules may specify that the minimum REQ-to-ACK delay parameter is set to the minimum value from the property invariants being generalized. The maximum REQ-to-ACK delay parameter is set to the maximum value from the property invariants being generalized. Continuing with the example from FIGS. 3A and 3B, suppose the trace specific property invariants $handshake(read_req, read_ack, 1, 3, 1, 0, 0) and $handshake(read_req, read_ack, 1, 5, 1, 0, 0) are being generalized. The first invariant has a max REQ-to-ACK delay of 3 and the second invariant has a max REQ-to-ACK delay of 5. The resulting generalized property would be $handshake (read_req, read_ack, 1, 5, 1, 0, 0) because the larger max REQ-to-ACK delay of "5" is used as the maximum delay in the generalized property invariant according to the generalization rules.

Referring back to FIG. 4A, in one embodiment the generalized invariant may be directly used to generate 442 a property. For example, the property generated for traces 305 and 310 may be "assert $handshake(read_req, read_ack, 1, 5, 1, 0, 0)" which is a assertion property that asserts that read_req and read_ack should always follow a specified handshaking behavior. In another embodiment, the generalized invariants are instead used to generate compound invariants, which are explained by reference to FIG. 4D.

Figure 4D:
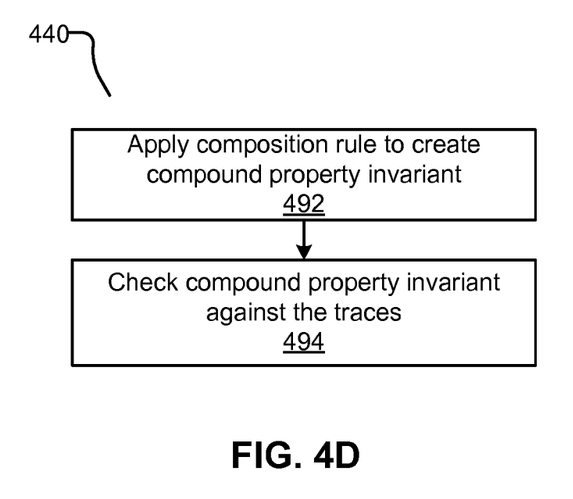
FIG. 4D is an expanded view of the step for combining compound property invariants into compound invariants, in accordance with an embodiment.

FIG. 4D is an expanded view of the step 440 for combining compound property invariants into compound invariants, in accordance with an embodiment. Compound property invariants represent a combination of simple property invariants (e.g., global invariants or trace specific invariants). The simple property invariants used to compose a compound property invariant may each have at least one signal that is different than the other simple property invariants, and the resulting compound property represents a relationship between all of the signals from all of the simple invariants. For example, the simple property invariants used to compose a compound invariant may be $mutex(a, b), $mutex(a,c) and $mutex(b,c). The mutex invariant indicates that two or more signals of the invariant are mutually exclusive, i.e. only one of the signals can be asserted at any given time. These invariants can be combined to create the compound property invariant of $mutex(a,b,c), which indicates that a, b and c are mutually exclusive such that only one of a, b and c is asserted at any given time.

To combine the simple invariants into the compound property invariant, in step 492, a composition rule is applied to the simple properties to create a compound property invariant. The precise composition rules applied depend on the type of compound property being generated. Specifically, to generate a fairness property invariant, the composition rules for the fairness property invariant require several handshake property invariants and a one-hot property invariant as inputs. The handshake property invariants and one-hot property invariants should be of the form:

$handshake(a0, b[0], ... )
$handshake(a1, b[1], ... )
$handshake(aN, b[N] ... )
$onehot0(b[N:0])

where a0, a1, and aN are individual signals representing requests to a resource and b is a group of signals N:0 representing acknowledgements of those requests. $onehot(b[N:0]) specifies that one and only one signal in b[N:0] can be asserted at any given time. The composition rules then combine these simple properties into the compound property of:

$fairness (a0, a1, ... , aN, b[N:0])

In other words, the handshake property invariants are used to recognize multiple requestors requesting access to a shared resource. The one-hot property invariant is used to recognize that only one request can be granted at any given time. The property invariants can then be combined to synthesize a fairness property that describes arbitration to the shared resource.

In step 494, the compound property invariant is verified against each of the traces to ensure that it is true. This step is a safety check to prevent un-true properties from being output to the user.

Referring back to FIG. 4A, in one embodiment the compound property invariant is used to generate 442 a property. For example, a fairness property generated by the property generation tool may take the form "assert $fairness (a0, a1, ... , aN, b[N:0])" which is an assertion property that asserts that signal vectors a and b should follow a particular arbitration policy so that no requestor is starved of access to a shared resource.

Additional Considerations

The foregoing description of the disclosed embodiments has been presented for the purpose of illustration; it is not intended to be exhaustive or to limit the disclosed embodiments to the precise forms disclosed. Persons skilled in the relevant art can appreciate that many modifications and variations are possible in light of the above disclosure.

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the present disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the present disclosure be limited not by this detailed description, but rather by any claims that issue on an application based hereon. Accordingly, the description of the disclosed embodiments is intended to be illustrative, but not limiting, of the scope of the present disclosure, which is set forth in the following claims.

What is claimed is:

1. A computer program product for property ranking, the computer program product comprising a non transitory computer-readable storage medium containing computer program code for:
generating a plurality of circuit design properties of a circuit design from a signal trace describing signal values for signals of the circuit design over a plurality of clock cycles;
performing a static analysis of the plurality of circuit design properties against one or more circuit design constraints to determine whether the circuit design properties are true;
determining rankings for the circuit design properties responsive to whether results of performing the static analysis of the circuit design properties against the one or more circuit design constraints indicate that the circuit design properties have unknown truth, the ranking for a property representing how valuable the property is to a circuit designer for validating functionality of the circuit design; and
presenting at least some of the circuit design properties in a user interface responsive to the rankings for the circuit design properties.

2. The computer program product of claim 1, wherein determining the rankings for the circuit design properties comprises determining the rankings for the circuit design properties responsive to whether the results indicate that the circuit design properties are true or false.

3. The computer program product of claim 1:
wherein the static analysis is restricted in duration, and
wherein a circuit design property has unknown truth if the duration expires prior to the static analysis determining whether the circuit design property is true.

4. The computer program product of claim 3, wherein the static analysis is restricted to a fixed length of time.

5. The computer program product of claim 3, wherein the static analysis is restricted to a fixed number of static analysis cycles.

6. The computer program product of claim 1, wherein performing the static analysis of the circuit design properties against one or more circuit design constraints comprises performing the static analysis of the circuit design properties against one or more baseline properties of the circuit design.

7. The computer program product of claim 1, wherein performing the static analysis of the circuit design properties against one or more circuit design constraints comprises performing the static analysis of the circuit design properties against a description of the circuit design.

8. The computer program product of claim 1, wherein the static analysis is formal verification.

9. The computer program product of claim 1, wherein:
determining rankings for the circuit design properties comprises assigning ranking scores to the properties, a ranking score for a property representing how valuable the property is to a circuit designer for validating functionality of the circuit design, and
the at least some of the circuit design properties are presented in the user interface based on the ranking scores of the circuit design properties.

10. The computer program product of claim 1, wherein:
determining rankings for the circuit design properties comprises assigning the properties to ranking categories, a ranking category for a property representing how valuable the property is to a circuit designer for validating functionality of the circuit design, and
the at least some of the circuit design properties are presented in the user interface based on the assigned ranking categories.

11. The computer program product of claim 1, wherein presenting at least some of the circuit design properties in the user interface comprises organizing at least some of the circuit design properties in the user interface responsive to the rankings for the circuit design properties.

12. A computer implemented method for property ranking, comprising:
generating a plurality of circuit design properties of a circuit design from a signal trace describing signal values for signals of the circuit design over a plurality of clock cycles;
performing a static analysis of the plurality of circuit design properties against one or more circuit design constraints to determine whether the circuit design properties are true;
determining, by a computer, rankings for the circuit design properties responsive to whether results of performing the static analysis of the circuit design properties against the one or more circuit design constraints indicate that the circuit design properties have unknown truth, the ranking for a property representing how valuable the property is to a circuit designer for validating functionality of the circuit design; and
presenting at least some of the circuit design properties in a user interface responsive to the rankings for the circuit design properties.

13. The method of claim 12, wherein determining the rankings for the circuit design properties comprises determining the rankings for the circuit design properties responsive to whether the results indicate that the circuit design properties are true or false.

14. The method of claim 12:
wherein the static analysis is restricted in duration, and
wherein a circuit design property has unknown truth if the duration expires prior to the static analysis determining whether the circuit design property is true.

15. The method of claim 14, wherein the static analysis is restricted to a fixed length of time.

16. The method of claim 14, wherein the static analysis is restricted to a fixed number of static analysis cycles.

17. The method of claim 12, wherein performing the static analysis of the circuit design properties against one or more circuit design constraints comprises performing the static analysis of the circuit design properties against one or more baseline properties of the circuit design.

18. The method of claim 12, wherein performing the static analysis of the circuit design properties against one or more circuit design constraints comprises performing the static analysis of the circuit design properties against a description of the circuit design.

19. The method of claim 12, wherein the static analysis is formal verification.

20. The method of claim 12, wherein:
determining rankings for the circuit design properties comprises assigning ranking scores to the properties, a ranking score for a property representing how valuable the property is to a circuit designer for validating functionality of the circuit design, and
the at least some of the circuit design properties are presented in the user interface based on the ranking scores of the circuit design properties.

21. The method of claim 12, wherein:
determining rankings for the circuit design properties comprises assigning the properties to ranking categories, a ranking category for a property representing how valuable the property is to a circuit designer for validating functionality of the circuit design, and
the at least some of the circuit design properties are presented in the user interface based on the assigned ranking categories.

22. The method of claim 12, wherein presenting at least some of the circuit design properties in the user interface comprises organizing at least some of the circuit design properties in the user interface responsive to the rankings for the circuit design properties.

* * * * *